(12) United States Patent
Lee et al.

(10) Patent No.: US 11,430,812 B2
(45) Date of Patent: Aug. 30, 2022

(54) NONVOLATILE MEMORY DEVICE INCLUDING FERROELECTRIC LAYER HAVING NEGATIVE CAPACITANCE

(71) Applicant: SK hynix Inc., Gyeonggi-do (KR)

(72) Inventors: Jae Gil Lee, Seoul (KR); Hyangkeun Yoo, Gyeonggi-do (KR); Se Ho Lee, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 73 days.

(21) Appl. No.: 16/821,186

(22) Filed: Mar. 17, 2020

(65) Prior Publication Data
US 2021/0035990 A1   Feb. 4, 2021

(30) Foreign Application Priority Data
Jul. 31, 2019  (KR) .................. 10-2019-0093548

(51) Int. Cl.
*H01L 21/00*    (2006.01)
*H01L 27/1159*  (2017.01)
*H01L 27/1157*  (2017.01)
*H01L 27/11565* (2017.01)

(52) U.S. Cl.
CPC ...... *H01L 27/1159* (2013.01); *H01L 27/1157* (2013.01); *H01L 27/11565* (2013.01)

(58) Field of Classification Search
CPC .......... H01L 27/1159; H01L 27/11565; H01L 27/1157
See application file for complete search history.

(56) References Cited

U.S. PATENT DOCUMENTS

| | | | |
|---|---|---|---|
| 9,837,435 B1 | 12/2017 | Chang et al. | |
| 10,937,904 B2* | 3/2021 | Liu | H01L 27/11582 |
| 2018/0182769 A1 | 6/2018 | Cheng et al. | |
| 2019/0148540 A1* | 5/2019 | Wang | H01L 29/78391 |
| | | | 257/321 |
| 2019/0237464 A1* | 8/2019 | Ching | H01L 21/823468 |

* cited by examiner

*Primary Examiner* — Richard A Booth
(74) *Attorney, Agent, or Firm* — IP & T Group LLP (57) ABSTRACT

A nonvolatile memory device according to an aspect of the present disclosure includes a substrate having a channel layer, a gate dielectric layer structure disposed on the channel layer, a ferroelectric layer disposed on the gate dielectric layer structure, and a gate electrode layer disposed on the ferroelectric layer. The gate dielectric layer structure has a positive capacitance. The ferroelectric layer has a negative capacitance. The gate dielectric layer structure includes a charge tunneling layer, a charge trap layer and a charge barrier layer disposed on the channel layer.

9 Claims, 8 Drawing Sheets

NONVOLATILE MEMORY DEVICE INCLUDING FERROELECTRIC LAYER HAVING NEGATIVE CAPACITANCE

CROSS-REFERENCE TO RELATED APPLICATION

The present application claims priority under 35 U.S.C 119(a) to Korean Patent Application No. 10-2019-0093548, filed on Jul. 31, 2019, which is herein incorporated by reference in its entirety.

BACKGROUND

1. Technical Field

The present disclosure relates generally to nonvolatile memory devices and, more particularly, to nonvolatile memory devices including a ferroelectric layer having a negative capacitance and methods of manufacturing the same.

2. Related Art

As the degree of integration of semiconductor devices increases, proper dissipation of the generated heat becomes more important. Researchers have been working on finding clever ways for reducing heat generation by reducing the operation voltage and the power consumption of a semiconductor. Moreover, even in the case of a memory device, the size of memory cells and peripheral circuits continue to decrease in order to accommodate the overall design rules. Accordingly, it is necessary to reduce the operation voltage applied to the memory device during the operation of a memory device in order for the various circuits of the memory device to be able to withstand the applied operation voltage and for the proper dissipation of the generated heat.

Meanwhile, an example of a memory device which has been widely used in recent years, includes a transistor type nonvolatile memory device employing a three-layer stacked structure of a charge tunneling layer, a charge trap layer and a charge barrier layer as a gate dielectric layer structure. The nonvolatile memory device can perform an operation of introducing charges from a substrate into the charge trap layer (program operation) or erasing the charges of the charge trap layer (erase operation). The charge trap layer performs a memory function by nonvolatile storage of the introduced charges. The nonvolatile memory device can be implemented in a three-dimensional NAND-type structure in which a plurality of cell transistors are connected to each other and have a string shape.

SUMMARY

Embodiments of the present disclosure provide nonvolatile memory devices capable of reducing an operation voltage externally applied to a gate electrode layer.

The nonvolatile memory device according to an aspect of the present disclosure includes a substrate having a channel layer, a gate dielectric layer structure disposed on the channel layer, a ferroelectric layer disposed on the gate dielectric layer structure, and a gate electrode layer disposed on the ferroelectric layer. The gate dielectric layer structure has a positive capacitance. The ferroelectric layer has a negative capacitance. The gate dielectric layer structure includes a charge tunneling layer, a charge trap layer and a charge barrier layer disposed on the channel layer.

The nonvolatile memory device according to another aspect of the present disclosure includes a substrate, an electrode stack structure disposed on the substrate, a trench that penetrates the electrode stack structure and exposed sidewall surfaces of the gate electrode layer and the interlayer insulation layer, a ferroelectric layer disposed to cover the interlayer insulation layer and the gate electrode layer along inner wall surface of the trench, a gate dielectric layer structure disposed on the ferroelectric layer, and a channel layer disposed on the gate dielectric layer structure. The gate dielectric layer structure has a positive capacitance. The ferroelectric layer has a negative capacitance. The electrode stack structure includes at least one gate electrode layer and at least one interlayer insulation layer that are alternatively stacked in a direction perpendicular to the substrate. The gate dielectric layer structure includes a charge tunneling layer, a charge trap layer and a charge barrier layer disposed on the channel layer.

DETAILED DESCRIPTION

Various embodiments of the present invention will now be described hereinafter with reference to the accompanying drawings. In the drawings, the dimensions of layers and regions may be exaggerated for clarity of illustration. As a whole, the drawings are described at an observer's viewpoint. If an element is referred to be located "on" or "under" another element, it may be understood that the element is directly located "on" or "under" the other element, or an additional element may be interposed between the element and the other element. The same reference numerals in the drawings refer to substantially the same elements in each drawing.

In addition, expression of a singular form of a word should be understood to include the plural forms of the word unless clearly used otherwise. It will be understood that the terms "comprise" or "have" are intended to specify the presence of a feature, a number, a step, an operation, an element, a part, or combinations thereof, but not used to preclude the presence or possibility of addition one or more other features, numbers, steps, operations, components, parts, or combinations thereof.

Figure 1:
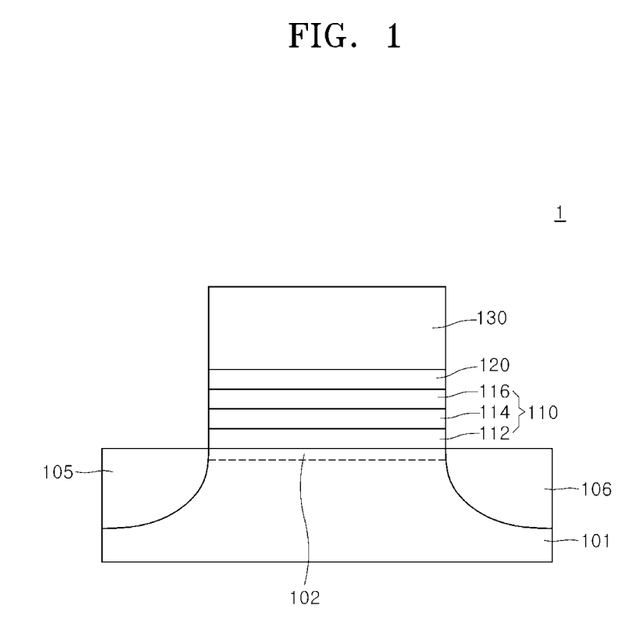
FIG. 1 is a cross-sectional view schematically illustrating a nonvolatile memory device according to an embodiment of the present disclosure.
Figure 2:
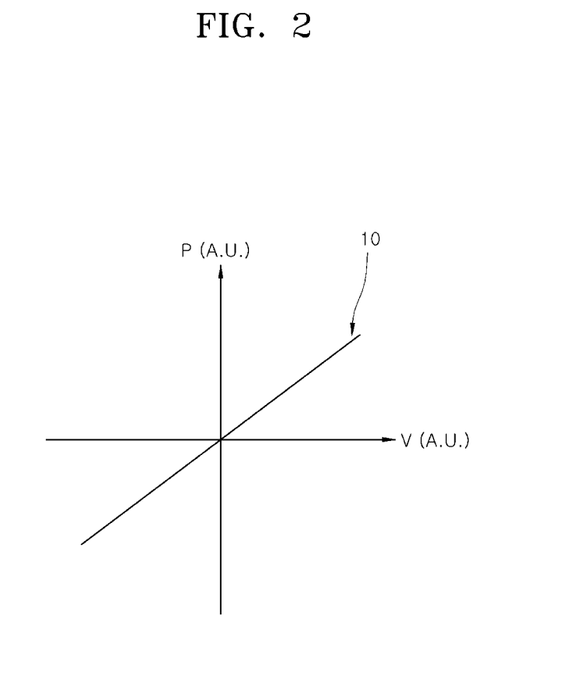
FIG. 2 is a graph illustrating polarization versus voltage for a gate dielectric layer structure having a positive capacitance.
Figure 3:
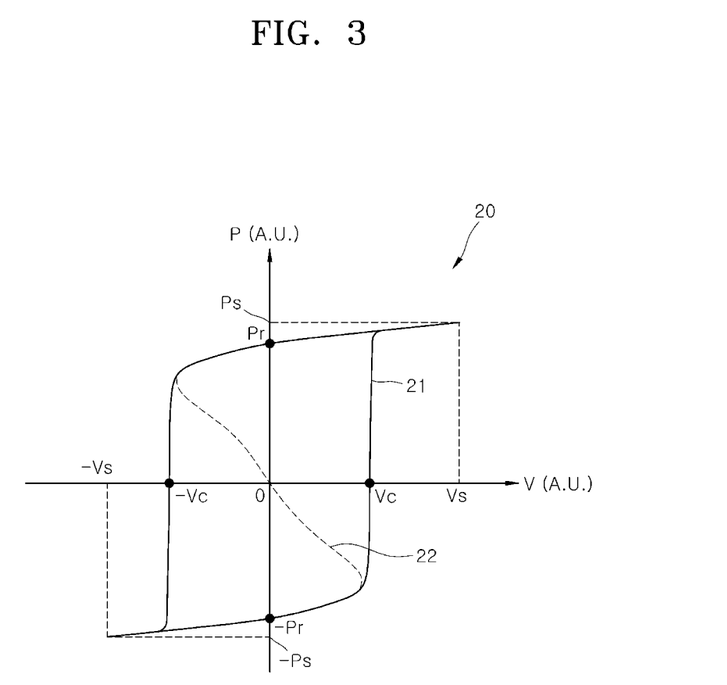
FIG. 3 is a graph illustrating polarization versus voltage for a gate dielectric layer structure having a negative capacitance.
Figure 4:
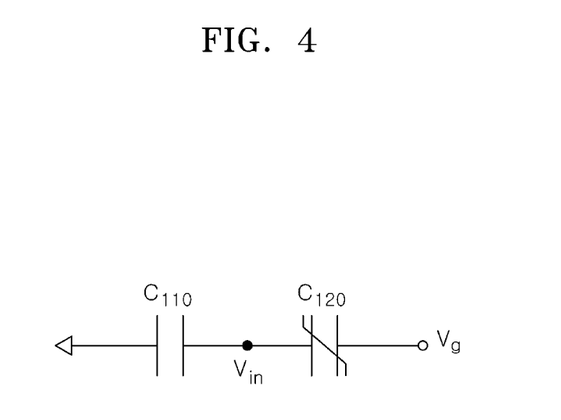
FIG. 4 is a circuit diagram in which a gate dielectric layer structure and a ferroelectric layer are connected in series as capacitors in a nonvolatile memory device according to an embodiment of the present disclosure.

FIG. 1 is a cross-sectional view schematically illustrating a nonvolatile memory device 1 according to an embodiment of the present disclosure. FIG. 2 is a graph illustrating polarization versus voltage for a gate dielectric layer structure having a positive capacitance. FIG. 3 is a graph illustrating polarization versus voltage for a gate dielectric layer structure having a negative capacitance. FIG. 4 is a circuit diagram in which a gate dielectric layer structure and a ferroelectric layer are connected in series as capacitors in the nonvolatile memory device 1 according to an embodiment of the present disclosure.

Referring to FIG. 1, the nonvolatile memory device 1 may include a substrate 101, a gate dielectric layer structure 110, a ferroelectric layer 120 and a gate electrode layer 130. The gate dielectric layer structure 110 may include a charge tunneling layer 112, a charge trap layer 114 and a charge barrier layer 116. In addition, the substrate 101 may include a channel layer 102 located under the gate dielectric layer structure 110, and a source region 105 and a drain region 106 that are located in regions of the substrate 101, which are located at opposite ends of the channel layer 102. In the illustrated embodiment of FIG. 1, the channel layer 102 may be located directly under the charge tunneling layer of the gate dielectric layer structure 110. Also, the charge trap layer 114 may be located directly on the charge tunneling layer 112, and the charge barrier layer 116 may be located directly on the charge trap layer 114. In addition, the ferroelectric layer may be located directly on the charge barrier layer 116, and the gate electrode 130 may be located directly on the ferroelectric layer 120. In an embodiment, the nonvolatile memory device 1 may be a flash memory device in the form of a field effect transistor.

The substrate 101 may, for example, include any suitable semiconductor material. The substrate 101 may, for example, be a silicon (Si) substrate, a gallium arsenide (GaAs) substrate, an indium phosphide (InP) substrate, a germanium (Ge) substrate, or a silicon germanium (SiGe) substrate. In an embodiment, the substrate 101 may be doped with a dopant to enhance its conductivity. For example, the dopant may be an n-type or a p-type dopant.

In an embodiment, the substrate 101 may include a well region doped with an n-type or a p-type dopant in the substrate 101. A source region 105 and a drain region 106 may be regions of the substrate 101 which are doped with a dopant of the opposite type than the dopant employed in the well region. For example, if the substrate 101 is doped with an n-type dopant then the source region 105 and the drain region 106 may be regions doped with a p-type dopant, and if the substrate 101 is doped with a p-type dopant then the source region 105 and the drain region 106 may be regions doped with an n-type dopant. In other words, the source region 105 and the drain region 106 may be regions doped with an opposite type dopant to that of the substrate 101. The channel layer 102 may be a region in which a carrier having a charge conducts when a voltage is applied between the source region 105 and the drain region 106. For example, the channel region 102 may refer to a region of the substrate 101, which has high mobility of electrons or holes between the source region 105 and the drain region 106.

The gate dielectric layer structure 110 may be disposed on the channel layer 102. More specifically, the gate dielectric layer structure 110 may be disposed directly on the channel layer 102. Also, the gate dielectric layer structure 110 may include the charge tunneling layer 112, the charge trap layer 114 and the charge barrier layer 116 sequentially disposed on top of each other above the channel layer 102. In an embodiment, the gate dielectric layer structure 110 may have a positive capacitance. The positive capacitance means a case in which the polarization P generated inside the dielectric layer has a positive slope with respect to an applied voltage V when the voltage V is applied to both ends of the dielectric layer, as illustrated in FIG. 2. In addition, a paraelectric layer means a material layer having a characteristic in which the polarization P inside the dielectric layer disappears when the applied voltage V is removed from the dielectric layer (i.e., the applied voltage is 0 V) among the dielectric layers having the positive capacitance. FIG. 2 is an example of the polarization characteristics of a paraelectric layer.

In an embodiment, the charge tunneling layer 112, the charge trap layer 114 and the charge barrier layer 116 may each be a paraelectric layer. As an example, the charge tunneling layer 112 may include silicon oxide. The charge trap layer 114 may include silicon nitride. The charge barrier layer 116 may include silicon oxide.

When a predetermined program voltage is applied between the substrate 101 and the gate dielectric layer structure 110, the electrons of the channel layer 102 may tunnel through the charge tunneling layer 112 and move to the charge trap layer 114, then may be trapped in the charge trap layer 114. In this case, the charge barrier layer 116 may function as an energy barrier layer that inhibits the electrons trapped in the charge trap layer 114 from moving to the ferroelectric layer 120 and the gate electrode layer 130. When a predetermined erase voltage is applied between the substrate 101 and the gate dielectric layer structure 110, holes from the channel layer 102 may tunnel through the charge tunneling layer 112 and move to the charge trap layer 114. The electrons may be erased by the recombination of the moved holes with the electrons trapped in the charge trap layer 114. Alternatively, the electrons trapped in the charge trap layer 114 may be erased from the charge trap layer 114 by tunneling through the charge tunneling layer 112 and moving to the channel layer 102 by the erase voltage.

Meanwhile, the ferroelectric layer 120 may be disposed on the gate dielectric layer structure 110. The ferroelectric layer 120 may be disposed directly on the gate dielectric layer structure 110. In an embodiment, the ferroelectric layer 120 may include hafnium oxide, zirconium oxide, hafnium zirconium oxide, or a combination of two or more thereof. In an embodiment, the ferroelectric layer 120 may be disposed to interface with the charge barrier layer 116. The ferroelectric layer 120 may directly interface with the charge barrier layer 116. The ferroelectric layer 120 may have a negative capacitance. The negative capacitance means a case in which the magnitude of the polarization P generated inside the ferroelectric layer has a graph portion 22 that changes to have a negative slope with respect to an applied voltage V when the voltage V is applied to both ends of the ferroelectric layer, as shown in FIG. 3. That is, the ferroelectric layer may be referred to as having a negative capacitance within the range of the graph portion 22. As will be described later, when a voltage corresponding to the coercive voltage Vc or −Vc of the ferroelectric layer is applied to the ferroelectric layer, the ferroelectric layer may have a negative capacitance.

Referring to FIG. 3, typically, the polarization P of the ferroelectric layer with respect to the applied voltage V may follow a hysteresis curve 21. The hysteresis curve 21 may be a closed loop having a pair of first and second coercive voltages Vc and −Vc and a pair of first and second remanent polarizations Pr and −Pr. The first and second remanent polarizations Pr and −Pr can be obtained by applying voltages equal to or greater than first and second saturation voltages Vs and −Vs to the ferroelectric layer, respectively, and removing the voltages. The first and second coercive voltages Vc and −Vc may each refer to voltages of minimum magnitude necessary to switch at least a portion of the remanent polarization stored in the ferroelectric layer in an opposite direction.

Meanwhile, it has been reported that the negative capacitance occurs when the ferroelectric layer is in an unstable state in terms of energy. Currently, the negative capacitance is described using a concept known as the phenomenological Landau free energy. Referring to FIG. 3 again, for example, when the ferroelectric layer has a second remanent polarization −Pr, a voltage sequentially increasing from 0 V in a positive direction may be applied to the ferroelectric layer. When the ferroelectric layer is in the unstable state, if the voltage reaches the first coercive voltage Vc, the polarization P of the ferroelectric layer may not change from a negative value to a positive value along the hysteresis curve 21, but may change from a negative value to a positive value along a new graph portion 22. That is, as a negative voltage is induced in the ferroelectric layer, the polarization P may change along the graph portion 22 having a negative slope.

Similarly, for example, when the ferroelectric layer has a first remanent polarization Pr, a voltage sequentially increasing from 0 V in a negative direction may be applied to the ferroelectric layer. When the ferroelectric layer is in the unstable state, if the voltage reaches the second coercive voltage −Vc, the polarization P of the ferroelectric layer may not change from a positive value to a negative value along the hysteresis curve 21, but may change from a positive value to a negative value along the new graph portion 22.

Moreover, the energy unstable state of the ferroelectric layer may be stabilized by electrically connecting the ferroelectric layer to a paraelectric layer in series. In an embodiment, the negative capacitance characteristic of the ferroelectric layer can be stably implemented by directly contacting the ferroelectric layer with the paraelectric layer. FIG. 4 illustrates a circuit diagram in which the gate dielectric layer structure 110 having a positive capacitance and the ferroelectric layer 120 having a negative capacitance are connected in series as capacitors.

Referring to FIG. 1 again, the gate electrode layer 130 may be disposed on the ferroelectric layer 120. The gate electrode layer 130 may be disposed directly on the ferroelectric layer 120. The gate electrode layer 130 may include a conductive material. The conductive material may, for example, include tungsten (W), titanium (Ti), copper (Cu), aluminum (Al), ruthenium (Ru), platinum (Pt), iridium (Ir), iridium oxide, tungsten nitride, titanium nitride, tantalum nitride, tungsten carbide, titanium carbide, tungsten silicide, titanium silicide, tantalum silicide, ruthenium oxide, or a combination of two or more thereof.

Hereinafter, a circuit in which each of the gate dielectric layer structure 110 and the ferroelectric layer 120 functions as a capacitor when a predetermined voltage is applied between the gate electrode layer 130 and the substrate 101 will be described in detail with reference to FIG. 4. For convenience of description, the substrate 101 is grounded, and the capacitance of the substrate 101 itself is excluded from discussion. In FIG. 4, the capacitance of the gate dielectric layer structure 110 is represented as $C_{110}$ and the capacitance of the ferroelectric layer 120 is represented as $C_{120}$.

As the gate dielectric layer structure 110 and the ferroelectric layer 120 are electrically connected in series, the total capacitance $C_{tot}$ of the series circuit can be calculated by the following Equation 1.

$$1/C_{tot}=1/C_{110}+1/C_{120} \tag{1}$$

In this case, the gate dielectric layer structure 110 includes the charge tunneling layer 112, the charge trap layer 114 and the charge barrier layer 116, which are the paraelectric layers connected in series, thus the capacitance $C_{110}$ of the gate dielectric layer structure 110 can be calculated by the following Equation 2.

$$1/C_{110}=1/C_{112}+1/C_{114}+1/C_{116} \tag{2}$$

In equation 2, $C_{112}$ is the capacitance of the charge tunneling layer 112, $C_{114}$ is the capacitance of the charge trap layer 114, and $C_{116}$ is the capacitance of the charge barrier layer 116.

Meanwhile, referring to FIG. 4 again, a gate voltage $V_g$ applied to the entire circuit may be divided into a first internal voltage $V_{in}$ applied to the gate dielectric layer structure 110 and a second internal voltage $V_g-V_{in}$ applied to the ferroelectric layer 120. In this case, the ratio of the first internal voltage $V_{in}$ to the gate voltage $V_g$ can be calculated by the following Equation 3.

$$V_{in}/V_g=C_{120}/(C_{110}+C_{120}) \tag{3}$$

As described above, when the ferroelectric layer 120 has a negative capacitance (i.e., $C_{120}<0$), and an absolute value of the capacitance of the ferroelectric layer 120 is greater than an absolute value of the capacitance of the gate dielectric layer structure 110 (i.e., $|C_{120}|>|C_{110}|$), $V_{in}/V_g$ may be greater than 1. In other words, the internal voltage applied to the gate dielectric layer structure 110 may be greater than the gate voltage applied to the gate electrode layer 130. This phenomenon may be referred to hereinafter also as amplification of the internal voltage.

Referring to FIG. 3 again, the internal voltage amplification may occur when the gate voltage sequentially increases from 0 V to reach the first voltage Vc or the second coercive voltage −Vc of the ferroelectric layer 120, respectively. That is, when a gate voltage corresponding to the polarization switching voltage of the ferroelectric layer 120 is applied, a voltage having a polarity opposite to that of the gate voltage may be induced in the ferroelectric layer 120 along the graph portion 22 to generate a negative capacitance. As a result, an internal voltage greater than the gate voltage may be applied to the gate dielectric layer structure 110. In this case, the internal voltage can function as a substantial operation voltage for introducing charges into the charge trap layer 114 in the gate dielectric layer structure 110 (program operation) or for erasing the charges of the charge trap layer 114 (erase operation). Accordingly, the gate voltage can be designed to be decreased by the increase of the internal voltage by using the phenomenon in which the internal voltage is amplified relative to the gate voltage. Accordingly, power consumption in the memory cells of the nonvolatile memory device can be effectively reduced by reducing the gate voltage applied to the gate electrode layer of the nonvolatile memory device.

Figure 5:
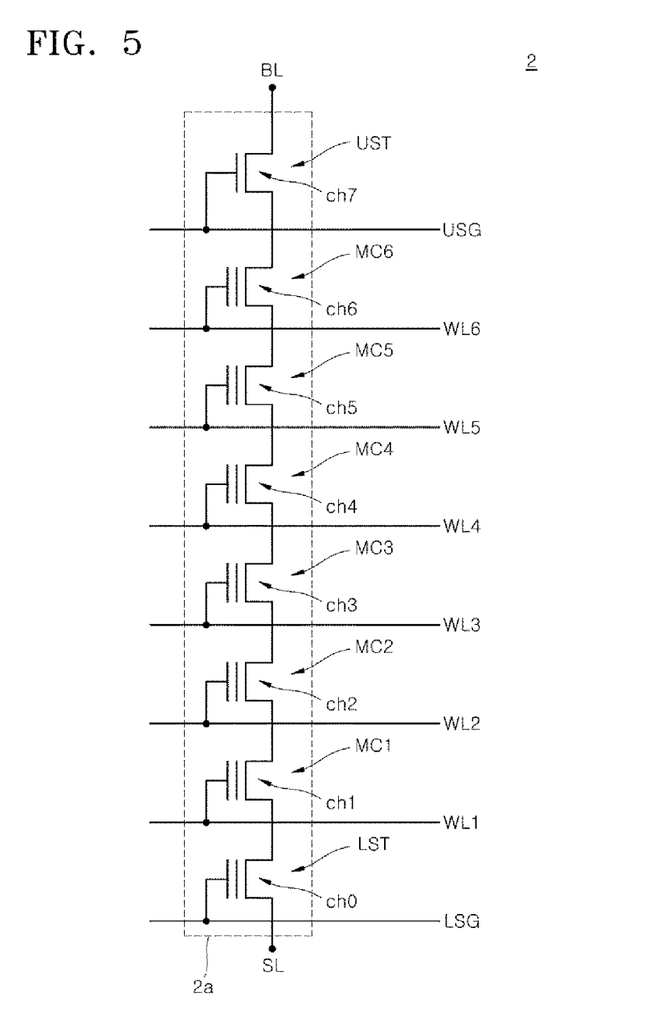
FIG. 5 is a circuit diagram schematically illustrating a nonvolatile memory device according to an embodiment of the present disclosure.

FIG. 5 is a circuit diagram schematically illustrating a nonvolatile memory device 2 according to an embodiment of the present disclosure. Referring to FIG. 5, the nonvolatile memory device 2 may include a string 2a having a plurality of cell arrays in which channels are connected to each other in series. One end of the string 2a may be connected to a source line SL and the other end of the string 2a may be connected to a bit line BL. The string 2a may have first to sixth memory cell transistors MC1, MC2, MC3, MC4, MC5 and MC6 connected to each other in series. In addition, the string 2a may include a lower selection transistor LST disposed between the first memory cell transistor MC1 and the source line SL, and an upper selection transistor UST disposed between the sixth memory cell transistor MC6 and the bit line BL.

Although FIG. 5 illustrates that the string 2a includes six memory cell transistors for convenience of description, the present disclosure is not necessarily limited thereto, and the number of memory cell transistors constituting the string 2a is not limited. In addition, FIG. 5 illustrates that the string 2a includes one lower selection transistor LST and one upper selection transistor UST, but the present disclosure is not necessarily limited thereto. As the lower selection transistor LST, a plurality of lower select transistors in which channels are connected in series to each other may be arranged. Likewise, as the upper selection transistor UST, a plurality of upper select transistors in which channels are connected in series to each other may be arranged. The nonvolatile memory deice 2 may be, for example, a NAND-type flash device.

The first to sixth memory cell transistors MC1, MC2, MC3, MC4, MC5 and MC6 may have corresponding first to sixth channel layers ch1, ch2, ch3, ch4, ch5 and ch6, respectively, between the source line SL and the bit line BL. The first to sixth memory cell transistors MC1, MC2, MC3, MC4, MC5 and MC6 may have charge trap layers adjacent to the first to sixth channel layers ch1, ch2, ch3, ch4, ch5 and ch6, respectively. Gate electrode layers of the first to sixth memory cell transistors MC1, MC2, MC3, MC4, MC5 and MC6 may be connected to different first to sixth channel layers ch1, ch2, ch3, ch4, ch5 and ch6, respectively. The upper selection transistor UST and the lower selection transistor LST may be turned on or turned off, respectively, to apply a voltage between the bit line BL and the source line SL to the first to sixth channel layers ch1, ch2, ch3, ch4, ch5 and ch6 respectively, or to remove the voltage from the first to sixth channel layers ch1, ch2, ch3, ch4, ch5 and ch6, respectively. The gate electrode layers of the upper selection transistor UST and the lower selection transistor LST may be connected to an upper selection line USL and a lower selection line LSL, respectively.

In an embodiment, the upper selection transistor UST and the lower selection transistor LST may be turned on, and a predetermined gate voltage may be applied to the corresponding memory cell transistors MC1, MC2, MC3, MC4, MC5 and MC6 through the first to sixth word lines WL1, WL2, WL3, WL4, WL5 and WL6. In the memory cell transistor to which the gate voltage is applied, a program operation or an erase operation may occur between the charge trap layer and the channel layer. The program operation or the erase operation may proceed as an operation in which electrons or holes in the channel layer are tunneled to the charge trap layer so that the electrons are introduced into the charge trap layer or the electrons stored in the charge trap layer are removed, respectively. The change of the electrons following the program operation or the erase operation may be stored in a non-volatile manner in the charge trap layer as an electrical signal. Accordingly, the first to sixth memory cell transistors MC1, MC2, MC3, MC4, MC5 and MC6 may perform nonvolatile memory operations.

Figure 6A:
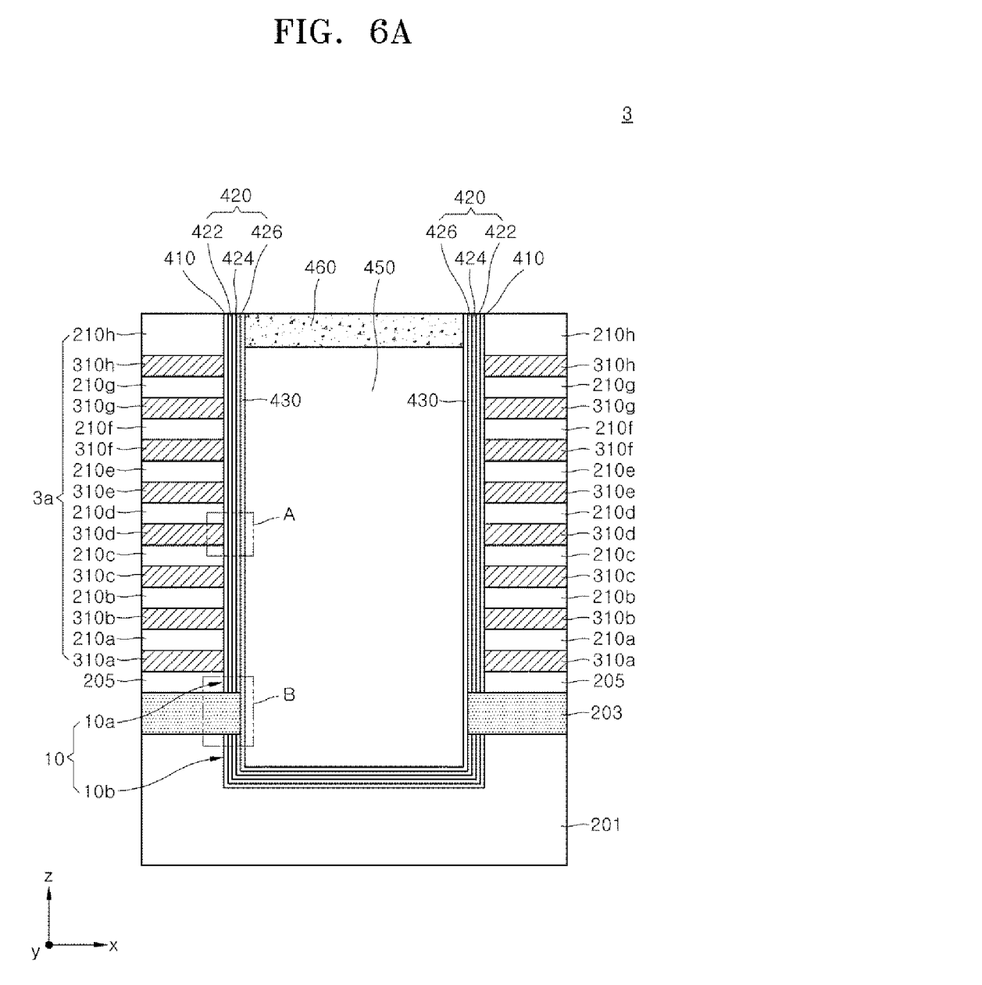
FIG. 6A is a cross-sectional view schematically illustrating a nonvolatile memory device according to an embodiment of the present disclosure.
Figure 6B:
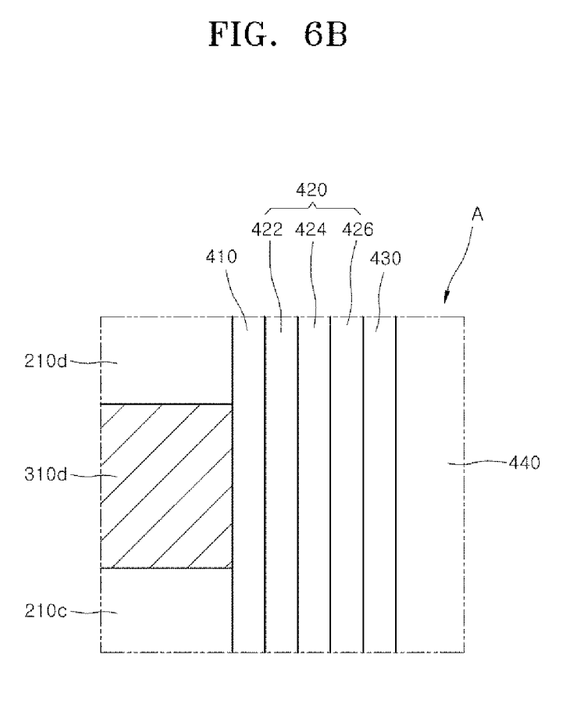
FIG. 6B is an enlarged view of region 'A' shown in FIG. 6A.
Figure 6C:
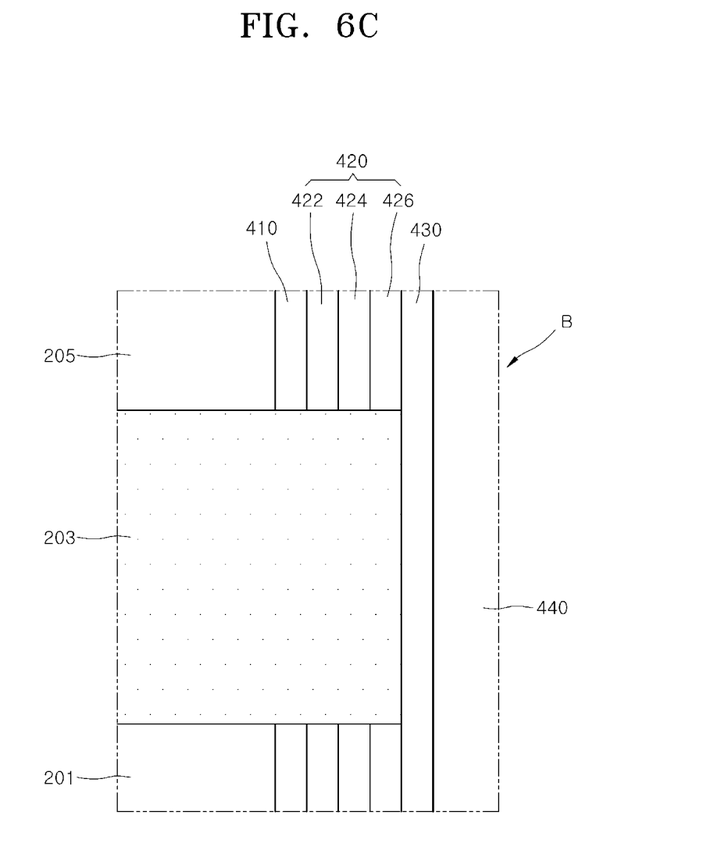
FIG. 6C is an enlarged view of region 'B' shown in FIG. 6A.

FIG. 6A is a cross-sectional view schematically illustrating a nonvolatile memory device 3 according to an embodiment of the present disclosure, FIG. 6B is an enlarged view of region 'A' shown in FIG. 6A, and FIG. 6C is an enlarged view of region 'B' shown in FIG. 6A. The nonvolatile memory device 3 of FIGS. 6A to 6C is an example of a nonvolatile memory device 2 having the circuit configuration of FIG. 5.

Referring to FIGS. 6A to 6C, the nonvolatile memory device 3 may include a substrate 201, and an electrode stack structure 3a disposed on the substrate 201. The electrode stack structure 3a may have first to eighth gate electrode layers 310a, 310b, 310c, 310d, 310e, 310f, 310g and 310h and first to eighth interlayer insulation layers 210a, 210b, 210c, 210d, 210e, 210f, 210g and 210h, which are alternately disposed. In an embodiment, the eighth interlayer insulation layer 210h may be thicker than the first to seventh interlayer insulation layers 210a, 210b, 210c, 210d, 210e, 210f and 210g. In an embodiment, the first to seventh interlayer insulation layers 210a, 210b, 210c, 210d, 210e, 210f and 210g may have the same thickness or substantially the same thickness. Likewise, the first to eighth gate electrode layers 310a, 310b, 310c, 310d, 310e, 310f, 310g and 310h may have the same thickness or substantially the same thickness.

In addition, the nonvolatile memory device 3 may include a trench 10 having a first portion 10a and a second portion 10b. The first portion 10a of the trench 10 may be formed to penetrate the electrode stack structure 3a over the substrate 201. The second portion 10b of the trench 10 may have a shape discontinuously extending under the first portion 10a and be formed in the substrate 201. The first portion 10a of the trench 10 may expose the sidewall surfaces of the first to eighth gate electrode layers 310a, 310b, 310c, 310d, 310e, 310f, 310g and 310h and the sidewall surfaces of the first to eighth interlayer insulation layers 210a, 210b, 210c, 210d, 210e, 210f, 210g and 210h.

A source contact layer 203 and a source insulation layer 205 may be disposed between the substrate 201 and the electrode stack structure 3a. The source contact layer 203 may separate the first portion 10a and the second portion 10b of the trench 10 from each other in a direction perpendicular to the substrate 201, that is, the z-direction. Side portions of the trench 10 may be partially entered by the source contact layer 203 in a direction parallel to the substrate 201. The trench 10 may be partially disconnected in the z-direction by the source contact layer 203.

The source contact layer 203 may include a conductive material. The source contact layer 203 may, for example, include a semiconductor material doped into n-type or p-type. Specifically, the source contact layer 203 may include n-type doped silicon. The source insulation layer 205 may electrically insulate the source contact layer 203 and the first gate electrode layer 310a. The source insulation layer 205 may, for example, include insulative oxide, insulative nitride, insulative oxynitride or the like.

The nonvolatile memory device 3 may include a ferroelectric layer 410 disposed along an inner surface of the trench 10. The ferroelectric layer 410 may extend in a direction perpendicular to the substrate 201, that is, the z-direction. Specifically, the ferroelectric layer 410 may be disposed to cover the first to eighth gate electrode layers 310a, 310b, 310c, 310d, 310e, 310f, 310g and 310h and the first to eighth interlayer insulation layers 210a, 210b, 210c, 210d, 210e, 210f, 210g and 210h along the inner surface of the first portion 10a of the trench 10. The source contact layer 203 may partially protrude inside the trench in the x direction to interrupt the continuity of the ferroelectric layer 410 and the gate dielectric structure 420 and directly contact the channel layer 430. In addition, the ferroelectric layer 410 may be disposed to cover the substrate 201 along the inner surface of the second portion 10b of the trench 10. In an embodiment, the ferroelectric layer 410 may have a negative capacitance. The ferroelectric layer 410 may be substantially the same as the ferroelectric layer 120 of the nonvolatile memory device 1 described above with reference to FIGS. 1 to 4.

In addition, the nonvolatile memory device 3 may include a gate dielectric layer structure 420 disposed on the ferroelectric layer 410 along the inner surface of the trench 10. The gate dielectric layer structure 420 may be disposed directly on the ferroelectric layer 410 along the inner surface of the trench 10. The gate dielectric layer structure 420 may extend in a direction perpendicular to the substrate 201, that is, the z-direction to cover the first to eighth gate electrode layers 310a, 310b, 310c, 310d, 310e, 310f, 310g and 310h and the first to eighth interlayer insulation layers 210a, 210b, 210c, 210d, 210e, 210f, 210g and 210h. The gate dielectric layer structure 420 may include a charge barrier layer 422, a charge trap layer 424 and a charge tunneling layer 426 that are sequentially disposed on the ferroelectric layer 410.

The charge barrier layer 422 may be disposed to interface with the ferroelectric layer 410. The charge barrier layer 422 may be disposed to interface directly with the ferroelectric layer 410. In an embodiment, the gate dielectric layer structure 420 may have a positive capacitance. The charge barrier layer 422, the charge trap layer 424 and the charge tunneling layer 426 may each be a paraelectric layer. The charge barrier layer 422, the charge trap layer 424 and the charge tunneling layer 426 may be the same or substantially the same as the charge barrier layer 126, the charge trap layer 124 and the charge tunneling layer 122 described above with reference to FIGS. 1 to 4.

In addition, the nonvolatile memory device 3 may include a channel layer 430 disposed on the gate dielectric layer 420 and the source contact layer 203. The channel layer 430 may be disposed directly on the gate dielectric layer 420 and the source contact layer 203. More specifically, referring to FIGS. 6A and 6C, as a portion of the channel layer 430 is disposed to contact the side surface of the source contact layer 203, the channel layer 430 may be electrically connected to the source contact layer 203. The channel layer 430 may, as an example, include a semiconductor material. The semiconductor material may include silicon (Si), germanium (Ge), silicon germanium (SiGe), gallium arsenide (GaAs), indium gallium arsenide (InGaAs), or a combination of two or more thereof. In an embodiment, the semiconductor material may be doped with a dopant of an n-type or p-type. The channel layer 430 may, as another example, include a conductive metal oxide. The conductive metal oxide may include indium-gallium-zinc oxide, indium-tin oxide or the like. Meanwhile, a filling insulation layer 450 may be disposed on the channel layer 430. In an embodiment, the filling insulation layer 450 may be disposed to fill the trench 10.

A channel contact layer 460 may be disposed on the filling insulation layer 450 to cap the trench while directly contacting the channel layer 430 with its sides. The channel contact layer 460 may be electrically connected to a bit line (not illustrated) so that an end of the channel layer 430 may be electrically connected to the bit line. As described above, the other end of the channel layer 430 may be connected to the source contact layer 203. The channel layer 430 via its connection with the source contact layer 203 may further be electrically connected to a source line (not illustrated).

Meanwhile, portions of the ferroelectric layer 410, the gate dielectric layer 420 and the channel layer 430 that are covered in a lateral direction (for example, the x-direction or the y-direction) by the first to eighth gate electrode layers 310a, 310b, 310c, 310d, 310e, 310f, 310g and 310h may constitute the lower selection transistor LST, the first to sixth memory cell transistors MC1, MC2, MC3, MC4, MC5 and MC6, and the upper selection transistor UST of the nonvolatile memory device 2 disclosed in FIG. 5, respectively.

Referring to FIGS. 6A to 6C again, the ferroelectric layer 410 may be disposed to contact the gate dielectric layer structure 420 having a positive capacitance. At this time, an absolute value of the capacitance of the ferroelectric layer 410 may be greater than an absolute value of the capacitance of the gate dielectric layer structure 420. When a gate voltage having a magnitude of the coercive voltages Vc and −Vc of the ferroelectric layer 410 is applied to at least one of the first to eighth gate electrode layers 310a, 310b, 310c, 310d, 310e, 310f, 310g and 310h, the ferroelectric layer 410 may allow an internal voltage greater than the gate voltage to be applied to the gate dielectric layer structure 420. In this case, the gate voltage having the magnitude of the coercive voltages Vc and −Vc may correspond to a polarization switching voltage of the ferroelectric layer 410.

The internal voltage applied to the gate dielectric layer structure 420 may generate charge movement between the gate dielectric layer structure 420 and the channel layer 430. In an embodiment, when the internal voltage is greater than a predetermined threshold voltage, a program operation or an erase operation may be generated with respect to the gate dielectric layer structure 420. In this case, the internal voltage generating the program operation or the erase operation may be referred to as a program voltage or an erase voltage.

Specifically, when the program voltage or the erase voltage is applied to the gate dielectric layer structure 420, the charge tunneling layer 426 may serve to tunnel electrons or holes from the channel layer 430 to the charge trap layer 424. When the internal voltage is less than the threshold voltage, the charge tunneling layer 426 may serve to suppress leakage current between the channel layer 430 and the charge trap layer 424.

The charge trap layer 424 may trap electrons introduced from the channel layer 430 in the trap sites of the charge trap layer 424 to store the electrons in a non-volatile manner during the program operation. In addition, the charge trap layer 424 may recombine holes introduced from the channel layer 430 with the electrons stored in the charge trap layer 424 to erase the stored electrons during the erase operation.

The charge barrier layer 422 may function as a barrier layer that prevents electrons or holes introduced from the channel layer 430 into the charge trap layer 424 from moving to the ferroelectric layer 410 and the gate electrode layers 310a, 310b, 310c, 310d, 310e, 310f, 310g and 310h.

As described above, according to the embodiment of the present disclosure, a nonvolatile memory device includes a gate dielectric layer structure having a positive capacitance and a ferroelectric layer having a negative capacitance, which are electrically connected to each other in series. When a gate voltage corresponding to a polarization switching voltage of the ferroelectric layer is applied to a gate electrode layer covering the gate dielectric layer structure and the ferroelectric layer, an internal voltage greater than the gate voltage may be applied to the gate dielectric layer structure. The internal voltage may function as a substantial operation voltage that introduces charges into the charge trap layer in the gate dielectric layer structure or erases charges in the charge trap layer.

As such, according to the embodiment of the present disclosure, by using the phenomenon that the internal voltage is amplified in comparison with the gate voltage, the gate voltage can be designed to be reduced by the increase of the internal voltage. Accordingly, power consumption in the memory cell of the nonvolatile memory device can be effectively reduced by decreasing the gate voltage applied to the gate electrode layer of the nonvolatile memory device.

The embodiments of the inventive concept have been disclosed above for illustrative purposes. Those of ordinary skill in the art will appreciate that various modifications, additions and substitutions are possible, without departing from the scope and spirit of the inventive concept as disclosed in the accompanying claims.

What is claimed is:

1. A nonvolatile memory device comprising:
a substrate having a channel layer;
a gate dielectric layer structure disposed on the channel layer;
an internal voltage amplification layer disposed on the gate dielectric layer structure; and
a gate electrode layer disposed on the internal voltage amplification layer,
wherein the gate dielectric layer structure has a positive capacitance,
wherein the internal voltage amplification layer is a ferroelectric layer having a negative capacitance,
wherein the gate dielectric layer structure comprises a charge tunneling layer, a charge trap layer and a charge barrier layer disposed on the channel layer,
wherein the nonvolatile memory device has an operation gate voltage corresponding to a polarization switching voltage of the internal voltage amplification layer,
wherein when the operation gate voltage is applied to the gate electrode layer, an internal voltage greater than the operation gate voltage is applied to the gate dielectric layer structure.

2. The nonvolatile memory device of claim 1,
wherein each of the charge tunneling layer, the charge trap layer and the charge barrier layer is a paraelectric layer.

3. The nonvolatile memory device of claim 2,
wherein the charge tunneling layer comprises silicon oxide,
wherein the charge trap layer comprises silicon nitride, and
wherein the charge barrier layer comprises silicon oxide.

4. The nonvolatile memory device of claim 1,
wherein the internal voltage amplification layer comprises at least one selected from the group consisting of hafnium oxide, zirconium oxide, and hafnium zirconium oxide.

5. The nonvolatile memory device of claim 1,
wherein the internal voltage amplification layer is disposed to interface with the charge barrier layer.

6. The nonvolatile memory device of claim 1,
wherein the gate dielectric layer structure and the internal voltage amplification layer are electrically connected to each other in series between the gate electrode layer and the channel layer.

7. The nonvolatile memory device of claim 6,
wherein an absolute value of a capacitance of the internal voltage amplification layer is greater than an absolute value of a capacitance of the gate dielectric layer structure.

8. The nonvolatile memory device of claim 1,
wherein the substrate comprises at least one selected from the group consisting of silicon (Si), germanium (Ge), silicon germanium (SiGe), gallium arsenide (GaAs), and indium phosphide (InP).

9. The nonvolatile memory device of claim 1, further comprising:
a source region and a drain region that are disposed in substrate regions of different ends of the channel layer.

* * * * *